April 14, 1964 R. C. MARCH ETAL 3,129,390

AUTOMATIC FREQUENCY CONTROL SYSTEMS
FOR OSCILLATION GENERATORS

Filed Aug. 29, 1960

INVENTORS
Roy Collins March
and
John Henry Howe
BY Baldwin & Wight
ATTORNEY 3,129,390
Patented Apr. 14, 1964

3,129,390

AUTOMATIC FREQUENCY CONTROL SYSTEMS FOR OSCILLATION GENERATORS

Roy Collins March, Chelmsford, England, and John Henry Howe, Auckland, New Zealand, assignors to The Marconi Company Limited, a British company Filed Aug. 29, 1960, Ser. No. 52,593
Claims priority, application Great Britain Nov. 10, 1959
7 Claims. (Cl. 331—8)

Figures 1, 2:
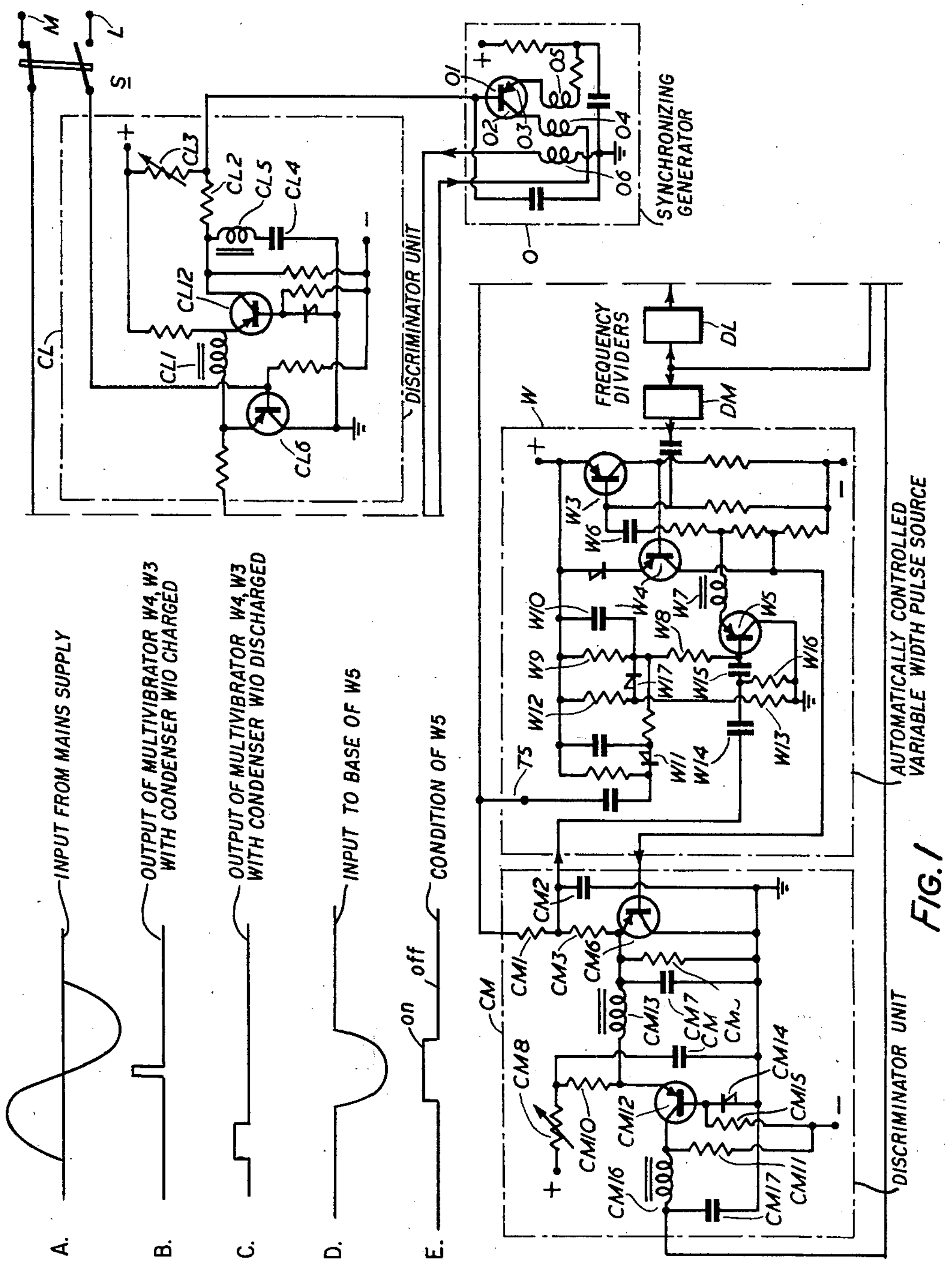

This invention relates to automatic frequency control systems for oscillation generators and has for its object to provide improved automatic frequency control systems suitable for use in television and other systems wherein an oscillation generator is required to be locked on to a reference frequency signal.

In television systems it is commonly required to lock a synchronising signal generator on to a reference frequency signal which might be, for example, a mains supply or a television line frequency supply. In some cases it is required to be able to lock the generator at will either to a mains supply or to a television line supply. It is very desirable that the generator, when locked on to the reference frequency source (whatever it may be) shall be in such condition that sudden changes of phase in the reference frequency supply and/or superimposed disturbances on that supply shall cause minimum variation in the generator frequency. It is also very desirable that, when the generator and its automatic frequency control system are first switched on, the generator shall be brought into lock automatically as rapidly as possible. It is further desirable that if one reference frequency is changed for another, lock shall be automatically re-established as rapidly as possible. The present invention enables these requirements to be satisfied.

According to this invention an automatic frequency control system for an oscillation generator adapted to be controlled in frequency by a control potential supplied thereto comprises said oscillation generator, a pulse source adapted to provide a train of output pulses having any of a plurality different widths of inter se, a switch device adapted to control the generation of one or other of the different widths of output pulse in dependence upon the setting of said switch device, means responsive to a wave derived from said reference frequency source for actuating said switch device to connect said pulse source to generate the narrowest pulse width of said output pulses when the phase relation between the reference source and the generator output is between pre-determined limits and means responsive to the phase relation between the selected pulses from said pulse source and a wave derived from said reference frequency source for producing a control potential and applying the same to said generator to control the frequency thereof to a value at which the phase relation between the wave derived from the generator output and the wave derived from the reference frequency source is between said predetermined limits.

Preferably the pulse source is adapted to provide either of two different widths of output pulse and the switch device is an electronic switch having two possible settings in one of which it is conductive and in the other of which it is cut off.

Preferably also the pulse source is a multivibrator having two pulse width determining circuits one of which includes an element in circuit with the electronic switch so as to be effective when said switch is in one of its states of conductivity and non-effective when said switch is in its other state of conductivity.

Preferably the electronic switch is a transistor connected to have a wave derived from the reference frequency source applied to its base.

Preferably a condenser, adapted to be charged by potential derived from the reference frequency source, is arranged to hold the switch in the condition in which a broad pulse output is selected from the pulse source until said condenser reaches a pre-determined state of charge.

Preferably again, the generator comprises a transistor with its collector and emitter circuits coupled to one another and the control potential is applied between the base and the collector electrode.

The means for producing the control potential may conveniently include a transistor having the selected pulse output from the pulse source applied to its base and a wave derived from the reference frequency source applied to one of its other electrodes.

The invention is illustrated in and further explained in connection with the accompanying drawings in which FIG. 1 shows one embodiment as applied to an installation in which a synchronising generator O may be locked either to a mains supply applied at terminal M or a line frequency supply applied at terminal L. FIG. 2 is an explanatory graphical figure.

In the embodiment shown in FIG. 1 choice can be made between locking the generator on to a mains frequency supply or power source at terminal M or a line scanning frequency supply at terminal L by means of a two-armature switch S which, in the position shown, procures locking on to the mains supply and in its other position procures locking on to the line frequency. The generator to be locked is within the block O and is designed to run at twice the line scanning frequency. The part of the apparatus which is in use when the switch S is in the position shown consists of a frequency divider DM, an automatically controlled variable width pulse source W, a discriminator unit CM and, of course, the generator O itself. When the switch is in its other position the frequency divider DL and the discriminator CL co-operate to control the generator O. In great Britain the power source frequency, or mains supply, is 50 cycles per second and the standard line scanning frequency is 10.125 kilocycles per second. In this instance the divider DM would have a division factor of 405. In the United States, however, the standard line scanning frequency is 15.75 kilocycles per second and the frequency of the mains, or power source is 60 cycles per second. The divider DM would therefore have a division factor of 525. It is common practice for the oscillator O to oscillate at a frequency which is twice the required line frequency and this practice is employed in the subject invention. Oscillator O therefore, assuming British standards, would be oscillating at 20.25 kilocycles per second, or, assuming United States standards, at a frequency of 31.5 kilocycles per second.

The generator O includes a transistor having a base O1, a collector O2 and an emitter O3. The tuned circuit determining the oscillating frequency is constituted by the inductance of a transformer primary O4 which is connected to the collector of the transistor and the self-capacity which exists between the collector and the base. The emitter O3 is connected to the secondary O5 of the transformer which has a third winding O6 from which the oscillatory output is taken. The oscillator O is a sine wave generator having feedback windings O4 and O5 connected so that the oscillator is a regenerative grounded base oscillator using positive feedback. The capacity between the collector and the base is a function of the collector-base voltage and this voltage can be varied by varying the collector-base voltage either by varying the collector voltage with the base earthed or by varying the base voltage with the collector voltage at fixed potential. In either event variation of the frequency of oscillation will be caused. When the switch S is in the position shown the oscillation frequency is varied by control voltage fed from the unit CM and applied through the winding O4 to the collector. When the switch is in its other position variation of frequency is effected by a control voltage fed out from the discriminator unit CL and fed to the base O1.

Describing the operation which takes place when switch S is in the position shown, it will be seen that output from the winding O6 is applied to the input of a frequency divider DM having (assuming present British television standards) a division factor of 405.

The divided output frequency from DM is fed to the base of transistor W3 in the unit W. This unit has three transistors of which the two transistors W3 and W4 are connected in a multivibrator circuit and the third W5 is an electronic switch. As will be seen this multivibrator will give a narrow pulse output or a broad pulse output depending upon whether or not an inductance W7 is effectively in circuit or not. The width of the broad pulse is determined by the value of a condenser W6 connected to the base of the transistor W3 and the values of the resistances shown associated with this condenser. The duration of the pulse produced by the multivibrator including transistors W3, W4 is controlled normally by the time constant of capacitor W6 and the associated unlabeled resistors. Inductance W7 and switch W5 merely provide a convenient and accurately controllable means for changing this time constant by connecting the inductance in the charging circuit of capacitor W6.

With the switch S in the position shown, mains frequency is applied to the unit W at terminal T5. If there is no input at terminal T5, transistor W5 will be cut off since its base is returned to the positive rail through the resistances W8 and W9. The inductance W7 which is connected to the emitter of the transformer W5 is therefore effectively out of circuit and is of no influence in determining the pulse width from the multivibrator. When, however, mains input appears at terminal T5, the condenser W10 which is connected across resistance W9 will gradually charge towards a negative potential the value of which is limited by a diode W17 which is connected between the junction point of the resistances W8 and W9 and the junction point of resistances W12 and W13 forming a potentiometer between the positive rail and earth.

The mains frequency is also applied through resistance CM1 (included in unit CM) and condensers W14 and W15 to the base of the transistor W5. These condensers W14 and W15 in conjunction with the resistance W16 connected between their junction point and earth, advance the phase of the input at the base of the transistor W5 in comparison with that at the junction point of the elements CM1 and CM3, the amount of advance being such that when the waveform at said junction point is going from maximum positive to maximum negative a negative half wave is appearing at the base of the transistor W5.

On first switching on, condenser W10 is discharged and the generator O will probably be a long way from being locked on to the mains frequency. So long as the condenser W10 is discharged transistor W5 is cut off and the multi-vibrator including the transistors W3 and W4 gives a wide pulse output which is transmitted to the unit CM which, in manner which will be described later, rapidly alters the frequency of the generator O towards the locked on value. During this process, condenser W10 charges negatively and when it reaches a predetermined charge the transistor W5 acts as a switch, becoming conductive when negative half waves are present on its base (that is to say when the mains input at the junction point of the elements CM1 and CM3 is varying from positive maximum to negative maximum). During such negative half waves at the base of the transistor W5 the inductance W7 is brought effectively into the circuit of the multivibrator which is accordingly set for the narrow pulse output.

This narrow pulse output is fed to the unit CM and, as will again be seen later, this unit gives relatively slow speed narrow range control of the generator O. If for any reason the pulse from the multivibrator occurs otherwise than during a period when the input at the junction point of elements CM1 and CM3 is going from positive maximum to negative maximum, the transistor W5 cuts off, taking the inductance W7 effectively out of circuit and setting the multivibrator pulse to give a broad pulse output which, fed to the unit CM gives broad range rapid control of the generator O. Stated in another manner, the object of providing the switch W5 is to provide a wide pulse output from the multivibrator W3, W4 when coarse tuning is required and a narrow pulse output when fine adjustment is required. Rapid coarse tuning is required in two circumstances, the first being when the system is initially switched on, when it can be assumed that the oscillator O will be a considerable distance out of synchronism with the reference source, and, secondly, rapid coarse tuning is required if for any reason during the normal operation of the system the oscillator tends to slip out of synchronism. The multivibrator provides a wide pulse when the inductance W17 is out of circuit, i.e., when W5 is cut off. The positive line potential applied to the base of W5 via resistances W8 and W9 is such that when capacitor W10 is in a discharged state W5 will not conduct even in response to the negative half-cycles of the alternating power supply voltage applied to its base via resistor CM1.

When capacitor W10 attains a full negative charge, transistor W5 will conduct in response to negative half-cycles of the supply voltage provided via resistor CM1, the result thus being that for a part of the period of every cycle of mains frequency transistor W5 conducts, connecting W7 in circuit and the multivibrator delivers a narrow pulse output. The output pulse of the multivibrator will, however, only be narrow if the pulse occurs during this last-mentioned part of the period. If the output pulse of the multivibrator occurs other than during that part of the period, then the pulse output will be wide. When the system is operating normally, i.e., when the oscillator O is correctly synchronized with the reference source, then a pulse will occur in the output of the multivibrator during the period when main supply waveform is going from maximum positive to maximum negative. This relationship is illustrated in FIGS. 2A and 2B. Condensers W14, W15, in conjunction with resistance W16, advance the phase of the mains voltage waveform applied to the base of transistor W5 in comparison with the mains voltage waveform occurring at the junction of resistors CM1, CM3. Therefore, when the system is in correct synchronism, the output pulse of the multivibrator is occurring when the mains voltage waveform is going from maximum positive to maximum negative and the negative half-cycle of the mains voltage waveform is applied to the base of transistor W5. Thus, transistor W5 is conducting, W7 is in circuit, and, therefore, the output pulse of multivibrator W3, W4 is of the required narrow type. The waveform of the input to the base of W5, in FIG. 2D, shows the degree of advance over the waveform at the junction of CM1 and CM3, FIG. 2A. FIG. 2E shows the transistor W5 conducting during the negative half-cycle of the wave shown in FIG. 2D, i.e., conducting as is required when the mains voltage at the junction of resistors CM1, CM3 is going from maximum negative to maximum positive. If, for any reason, the oscillator O begins to slip out of synchronism with the reference source and an output pulse from the multivibrator occurs other than at a time when the mains voltage at the junction of resistors CM1, CM3 is going from maximum negative to maximum positive, the pulse generated by transistors W3, W4 will be wide as required to regain synchronism. This situation prevails because at any time other than during the period when a negative half-cycle of the mains voltage is applied to the base of W5, transistor W5 is not conducting, and the multivibrator W3, W4 is set for wide pulse operation because W7 is effectively not in the multivibrator circuit.

The pulse output from the multivibrator in the unit W is fed from the collector of transistor W4 to the base of transistor CM6 in the unit CM. With the switch S in the position shown, mains frequency is fed through the resistances CM1 and CM3 to the emitter of transistor CM6. The junction point of resistances CM1 and CM3 is connected to earth through condenser CM2. Between input pulses from the unit W the transistor CM6 is conductive presenting a very low impedance between emitter and collector. When a positive pulse occurs on the base of transistor CM6, however, it is cut off and current flows from mains supply M through inductance CM13 to the emitter of a second transistor CM12 in the unit CM, the strength and polarity of the current depending upon the relative phase of the two inputs fed one to the base and the other to the emitter of the transistor CM6. The inductance CM13 is large and the series resistances provided by the emitter-collector resistance of transistor CM6 and the emitter-base resistance of transistor CM12 are low so that when transistor CM6 conducts there is no appreciable decay of current through the inductance. The integrated current flowing into the emitter of transistor CM12 provides an almost equal current in its collector circuit and this is converted by the load resistance into a control voltage which is fed through coil O4 to the collector O2 of the transistor in the generator O to vary the frequency thereof.

The resistance CM1 and the condenser CM2 serve as a filter which is followed by the resistance CM3 which latter is part of the charging time constant of the following circuit. Resistance CM5 sets the potential of the mains frequency input to the correct value at the emitter of transistor CM6 and condenser CM7 enhances the effect of change of pulse width (brought about by transistor W5) and removes high frequency effects which would otherwise appear. The adjustable resistance CM8 in the direct current feed circuit of the emitter of transistor CM12 gives a measure of control of the free running frequency of the generator O and together with condenser CM9 de-couples the positive direct current feed source. Resistances CM10 and CM11 are chosen to give a low input impedance at transistor CM12 and set the standing direct current output component from the said transistor CM12 at a suitable value. The diode CM14 in conjunction with the resistance CM15 provide compensation for voltage changes between the base and emitter of transistor CM12 due to temperature variations of transistor CM12 and the inductance CM16 in conjunction with the condenser CM17 provide a smoothing circuit for limiting any phase modulation which might be present, e.g. phase modulation due to insufficient smoothing of the direct current feed source.

In FIGURE 2 which is a graphical figure explanatory of the operation of the arrangement when locked to the mains, the sine wave in line A represents the mains input at the junction point of elements CM1 and CM3; the narrow pulse in line B shows the pulse produced by the multivibrator in unit W when lock has been established; the broad pulse in line C shows the wide pulse produced by the multivibrator in unit W which enables lock to be retained if for any reason the waveform at A becomes subjected to excessive frequency variations; the curve of line D represents the input to the base of transistor W5; and E represents the on-off condition of transistor W5. In summarizing the operation of discriminator CM, the following explanation is submitted. Transistor CM6 is normally forwardly biased. The pulses applied to the base of CM6 from W4 are positive in polarity and render CM6 non-conducting. The signal applied to the emitter of transistor CM6 at the time a cutoff pulse is applied to its base will be the signal flowing through inductance CM13 and fed to the oscillator O as control. The polarity and magnitude of this signal will depend on whether the oscillator is in synchronism with the reference source or, if it is out of synchronism, how far it is out of synchronism.

As already stated the arrangement of FIGURE 1 enables the generator O to be locked at will either on to a line frequency supply or a mains supply. For locking on to the line frequency supply the switch S is put into its other position and in place of the units DM, W and CM the units DL and CL are brought into use. Unit DL is a frequency divider which divides by the factor 2. There is no automatic pulse width control unit corresponding to the unit W as this is considered unnecessary when locking on to line frequency. The discriminator unit CL is generally similar to the unit CM and performs similar functions so that detailed description is thought unnecessary. The main differences between units CL and CM is that the inductance CL1 in the former unit is of considerable lower value than the corresponding inductance CM13 in the latter unit and the output from the said unit CL is caused to vary with respect to earth potential, being applied to the base of the transistor in the generator O. The variable resistance CL3 provides a measure of control of the free running frequency of the oscillator O and this resistance and the resistance CL2 provide the required direct current potentials.

If the line frequency input which, as will be seen, is applied to the base of the transistor CL6 in unit CL should be briefly interrupted the base O1 of the transistor in generator O will still be maintained at its previous potential by the action of a storage condenser CL4, an inductance CL5 serving to limit the loss of locking range which would otherwise result if the condenser CL4 were directly connected to the collector of the transistor CL12. As will at once be apparent the transistor CL6 in unit CL corresponds in function to the transistor CM6 in unit CM and the transistor CL12 in unit CL likewise corresponds in function to the transistor CM12 in unit CM.

We claim:

1. An automatic frequency control system for an oscillation generator adapted to be controlled in frequency by a control potential supplied thereto, said system comprising said oscillation generator, a pulse source coupled to the output of said generator and adapted to provide a train of output pulses having any of a plurality of different widths inter se, a switch device coupled to said pulse source to cause said pulse source to generate one or other of the different widths of output pulse in dependence upon the condition of said switch device, a reference frequency source means coupled to said switch and to said reference frequency source and responsive to a wave derived from said reference frequency source for actuating said switch device to cause said pulse source to generate the narrowest pulse width of said output pulses when the phase relation between the reference source and the generator output approaches synchronization and means responsive to the phase relation between the selected pulses from said pulse source and a wave derived from said reference frequency source for producing a control potential and means for applying the same to said generator to control the frequency thereof to a value at which the wave derived from the generator output and the wave derived from the reference frequency source are synchronized.

2. A system as claimed in claim 1 wherein the pulse source is adapted to provide either of two different widths of output pulse and the switch device is an electronic switch having two possible states in one of which it is conductive and in the other of which it is non-conductive.

3. A system as claimed in claim 1 wherein said switch is electronic and has two states of conductivity and wherein the pulse source is a multivibrator having two selectable pulse width determining circuits one of which includes an element in circuit with the electronic switch so as to be coupled to said multivibrator when said switch is in one of its states of conductivity and decoupled from said multivibrator when said switch is in its other state of conductivity.

4. A system as claimed in claim 1 wherein said switch is a transistor having two current carrying electrodes and a control electrode, said control electrode being connected to said reference frequency source to have a wave derived from the reference frequency source applied to said control electrode and having one of the other electrodes connected to said pulse source.

5. A system as claimed in claim 1 wherein a condenser is connected to said reference frequency source and is adapted to be charged by potential derived from the reference frequency source, said condenser being coupled to said switch to hold the switch in the condition in which a broad pulse output is generated by the pulse source until said condenser reaches a predetermined state of charge.

6. A system as claimed in claim 1 wherein the generator comprises a transistor and reactance means with its collector and emitter circuits coupled to one another through said reactance means and wherein the control potential is applied to the collector electrode with respect to one of the other electrodes.

7. A system as claimed in claim 1 wherein the means for producing the control potential includes a transistor coupled to said pulse source and having the selected pulse output from the pulse source applied to its base and a wave derived from the reference frequency source applied to one of its other electrodes.

References Cited in the file of this patent

UNITED STATES PATENTS 2,790,905 Wright ---------------- Apr. 30, 1957